(12) United States Patent
Douglas et al.

(10) Patent No.: US 7,763,396 B2
(45) Date of Patent: Jul. 27, 2010

(54) METHOD AND APPARATUS FOR FABRICATING SEMICONDUCTOR CHIPS USING VARYING AREAS OF PRECISION

(75) Inventors: David C. Douglas, Palo Alto, CA (US);
Ronald Ho, Mountain View, CA (US);
Robert J. Drost, Los Altos, CA (US)

(73) Assignee: Oracle America, Inc., Redwood Shores, CA (US)

( * ) Notice: Subject to any disclaimer, the term of this patent is extended or adjusted under 35 U.S.C. 154(b) by 938 days.

(21) Appl. No.: 11/355,757

(22) Filed: Feb. 16, 2006

(65) Prior Publication Data

US 2007/0190432 A1 Aug. 16, 2007

(51) Int. Cl.
*G03F 9/00* (2006.01)
(52) U.S. Cl. .......................................... 430/5; 430/311
(58) Field of Classification Search ............... 430/311, 430/394, 5
See application file for complete search history.

(56) References Cited

U.S. PATENT DOCUMENTS 6,391,791 B1 * 5/2002 Sasaki et al. ................ 438/725

* cited by examiner

*Primary Examiner*—Kathleen Duda
*Assistant Examiner*—Caleen O Sullivan
(74) *Attorney, Agent, or Firm*—Park, Vaughan & Fleming LLP

(57) ABSTRACT

A system that fabricates a semiconductor chip. The system places patterns for components which require fine line-widths within a high resolution region of a reticle, wherein the high resolution region provides sharp focus for a given wavelength of light used by the lithography system. At the same time, the system places patterns for components which do not require fine line-widths outside of the high-resolution region of the reticle, thereby utilizing the region outside of the high-resolution region of the reticle instead of avoiding the region. Note that the coarseness for components placed outside of the high resolution region of the reticle is increased to compensate for the loss of optical focus outside of the high resolution region.

7 Claims, 4 Drawing Sheets

METHOD AND APPARATUS FOR FABRICATING SEMICONDUCTOR CHIPS USING VARYING AREAS OF PRECISION

BACKGROUND

1. Field of the Invention

The present invention relates to techniques for fabricating a semiconductor chip. More specifically, the present invention relates to a method and apparatus for fabricating a semiconductor chip using patterns that have varying levels of precision for different regions of a reticle that is used to lithographically expose the semiconductor chip.

2. Related Art

Semiconductor foundries use lithographic techniques to create modern semiconductor chips. During the semiconductor fabrication process, light passes through a photomask within a reticle and exposes a photoresist layer previously spun onto a wafer. This light defines patterns on the surface of the wafer that can be filled with metals or that can be implanted with dopants, thereby creating transistors and wires. Presently, ultraviolet light, with a wavelength of 193 nm, is used to expose the photoresist layer.

The minimum feature size supported by a given lithographic technology does not need to correspond to the wavelength of light which is used. For example, present lithographic technologies support minimum feature sizes under 50 nm, yet can be accurately imaged with light that has a much larger wavelength (for example, 193 nm). This seeming contradiction is made possible by several resolution-enhancing techniques, such as phase-shifting masks, off-axis illumination, and optical proximity correction. Unfortunately, as lithographic technology scales to finer and finer feature sizes, the ability to focus coarse wavelengths of light through very finely patterned reticles becomes more difficult.

As lithographic technology approaches the diffraction limit of light, the maximum reticle (photomask) size decreases. Consequently, even with the advanced resolution-enhancing techniques available to foundries, the maximum region of lithographic "focus" continues to narrow. This reduces the individual die size available to VLSI designers.

One solution to this problem is to use 157 nm wavelength light, which helps resolution, and thus increases the maximum reticle size. Unfortunately, lithography systems which use 157 nm wavelength light require photomasks made of calcium fluoride, which exhibits polarization-dependent light refraction (or "birefringence"). This characteristic is causing significant problems. Consequently, lithographic systems which use 157 nm wavelength light are not expected to hit production for several years. Furthermore, 157 nm wavelength light only improves the situation marginally over 193 nm wavelength light.

Another solution is to use extreme UV (EUV) light, or to use a wavelength of light near 30 nm. This solution dramatically reduces the reticle focusing issues, but EUV is even further away from production than 157 nm wavelength light. Furthermore, EUV light has several problems including being easily diffracted and easily absorbed in air.

Hence, what is needed is a method and an apparatus for fabricating semiconductor chips without the problems described above.

SUMMARY

One embodiment of the present invention provides a system that fabricates a semiconductor chip. The system places patterns for components which require fine line-widths within a high resolution region of a reticle, wherein the high resolution region provides sharp focus for a given wavelength of light used by the lithography system. At the same time, the system places patterns for components which do not require fine line-widths outside of the high-resolution region of the reticle, thereby utilizing the region outside of the high-resolution region of the reticle instead of avoiding the region. Note that the coarseness for components placed outside of the high resolution region of the reticle is increased to compensate for the loss of optical focus outside of the high resolution region.

In a variation on this embodiment, while placing the patterns for components which require fine line-widths, the system places patterns for dense, finely-patterned memory structures within the high resolution region of the reticle.

In a variation on this embodiment, while placing the patterns for components which do not require fine line-widths, the system places patterns for coarse wires and coarse transistors outside of the high-resolution region of the reticle.

In a variation on this embodiment, while placing the patterns for components which do not require fine line-widths, the system places patterns for capacitively, inductively, or optically coupled terminals outside of the high resolution region of the reticle.

In a variation on this embodiment, the coarseness of patterns placed outside of the high-resolution region of the reticle increases by gradual changes in the minimum dimensions of transistors and wires as the patterns are placed further from the high-resolution region of the reticle.

In a variation on this embodiment, the coarseness of patterns placed outside of the high-resolution region of the reticle increases by large focus-steps at the boundary between the high-resolution region of the reticle and the region outside of the high-resolution region of the reticle.

In a variation on this embodiment, the system creates multiple large reticles, which have a dense core within a high resolution region, and which have coarse wires outside of the high resolution region. The system then images the large reticles across a wafer by stepping the reticles so that the coarse wires overlap and intersect, thereby obviating the need to use separate lithographic masks for the dense cores and for the coarse wires between the dense cores to create a wafer-scale integration chip.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The present invention uses the die area outside of the traditionally focused reticle to fabricate components. Instead of avoiding this area of reduced precision, the present invention uses this area to layout structures with features that are coarser than what can be achieved within high-resolution region of the reticle, thereby overcoming the increasing constraints on die area due to limited focus.

Figure 1:
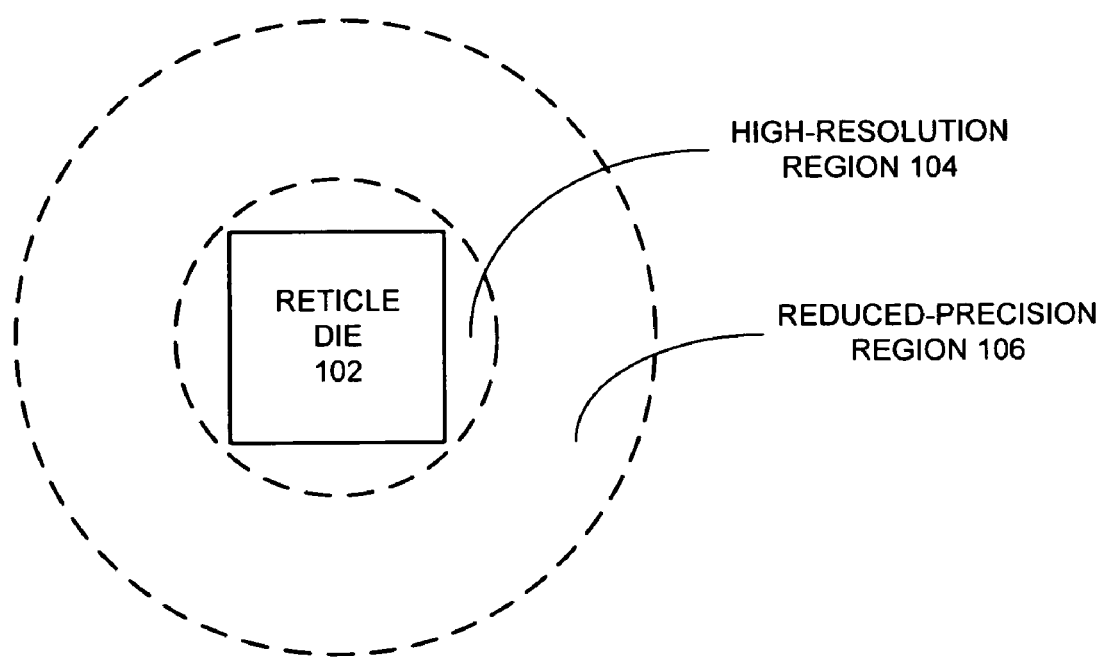
FIG. 1 illustrates a high-precision die in a larger region of low precision in accordance with an embodiment of the present invention.

For example, FIG. 1 illustrates a reticle die 102 within a high-resolution region 104 of a reticle in accordance with an embodiment of the present invention. Note that a reduced-precision region 106 lies outside of high-precision region 104.

For example, a 4 cm$^2$ microprocessor fabricated on an advanced lithographic process can fill the entire area of the traditional reticle. Note that the layout for the microprocessor is well-controlled and is precise within the high-precision reticle field.

In one embodiment of the present invention, a semiconductor chip is fabricated using a reticle area that is much larger than the traditional high-resolution region of the reticle.

For example, a circular area 30 cm$^2$ is used to fabricate a 4 cm$^2$ semiconductor chip. Of this 30 cm$^2$ area, only the central 4 cm$^2$ area offers the full-resolution of the lithographic process because the light can be well-focused only within that center high-resolution region. On the remaining peripheral 26 cm$^2$ area, coarse wires and coarse transistors can be patterned.

Figure 2:
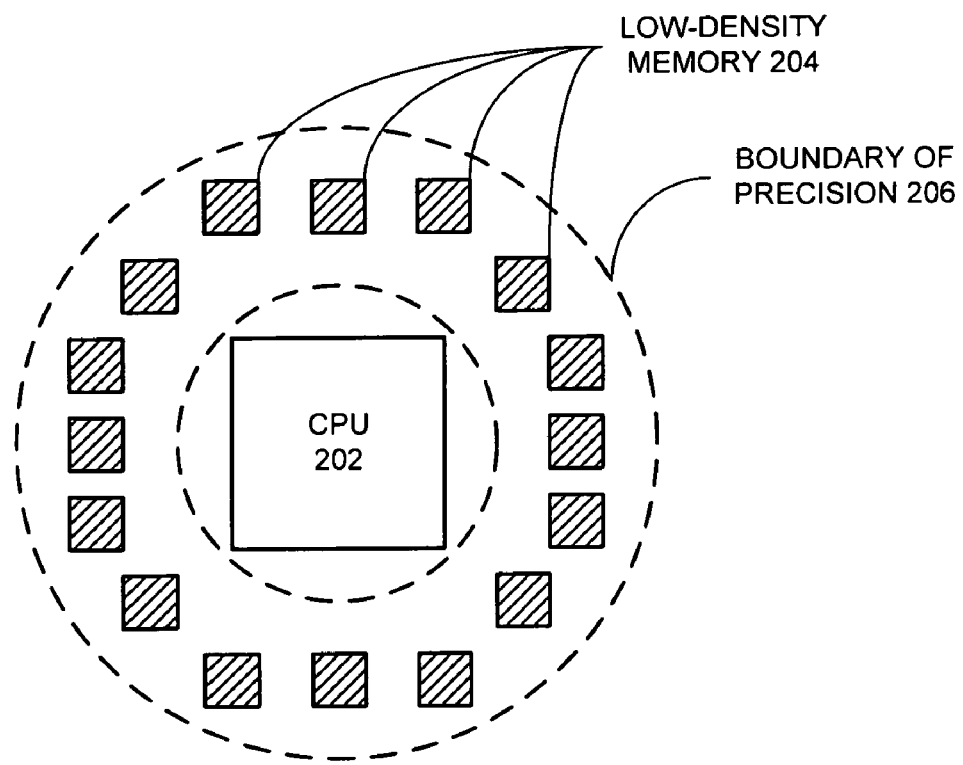
FIG. 2 illustrates a high-precision CPU surrounded by low-density memory in accordance with an embodiment of the present invention.

For example, FIG. 2 illustrates high-precision CPU 202 surrounded by low-density memory 204 in accordance with an embodiment of the present invention. Note that both CPU 202 and low-density memory 204 are within boundary-of-precision area 206. Note that coarse wires and coarse transistors can be used to create low-density memory 204. The dimensions of these coarse devices must be larger to overcome the loss of focus in the region outside of the high-resolution region of the reticle. Although the resulting memory is lower density than what is available at the center of the reticle, the memory is on-chip and can hence be accessed more quickly than memory which is located off-chip.

Figure 3:
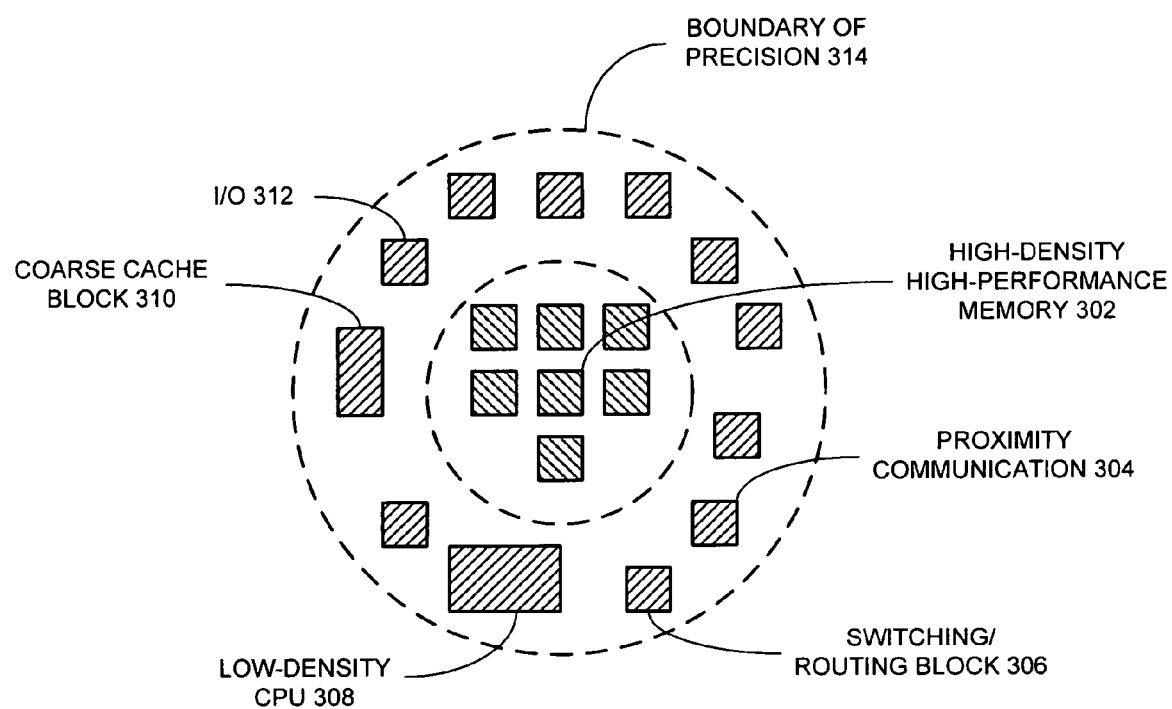
FIG. 3 illustrates a high-precision memory surrounded by low-density components in accordance with an embodiment of the present invention.

FIG. 3 illustrates high-density, high-performance memory 302 surrounded by low-density components in accordance with an embodiment of the present invention. These low-density components can include Proximity Communication components 304, switching/routing block 306, low-density CPU 308, coarse cache block 310, I/O 312. Note that all of these components are within boundary-of-precision 314.

Proximity Communication components allow semiconductor chips to communicate with each other without using wires. For example, Proximity Communication terminals can include capacitively-coupled terminals, inductively-coupled terminals, and optically-coupled terminals.

In one embodiment of the present invention, a dense, finely-patterned memory structure is placed at the core of a die and will be exposed by the high-precision region of the reticle. Coarse wires and coarse transistors are placed around the core and will be exposed by a lower-precision region of the reticle to switch data, perform I/O, and do light-weight computation.

In one embodiment of the present invention, low-cost (low-density) Proximity Communication regions are placed on the outer coarse region of the reticle. Because Proximity Communication offers high-bandwidth chip-to-chip communication, relatively coarse pads can be fabricated yet still offer sufficient bandwidth for computing purposes.

The increase in feature coarseness when moving from the core of each reticle to the periphery region ideally meets or exceeds the loss of optical focus from the lithographic system. Note that the present invention counteracts the loss of die size due to optical diffusion. This enables fabrication of larger chips; however, the edges of these chips contain coarser features than features found in within the core of the chip.

One embodiment of the present invention introduces a gradual change in the minimum dimension of features as the features are located further from the high-resolution region of the reticle.

One embodiment of the present invention uses large focus-steps at the boundary between the core and the periphery to increase the feature coarseness.

Figure 4:
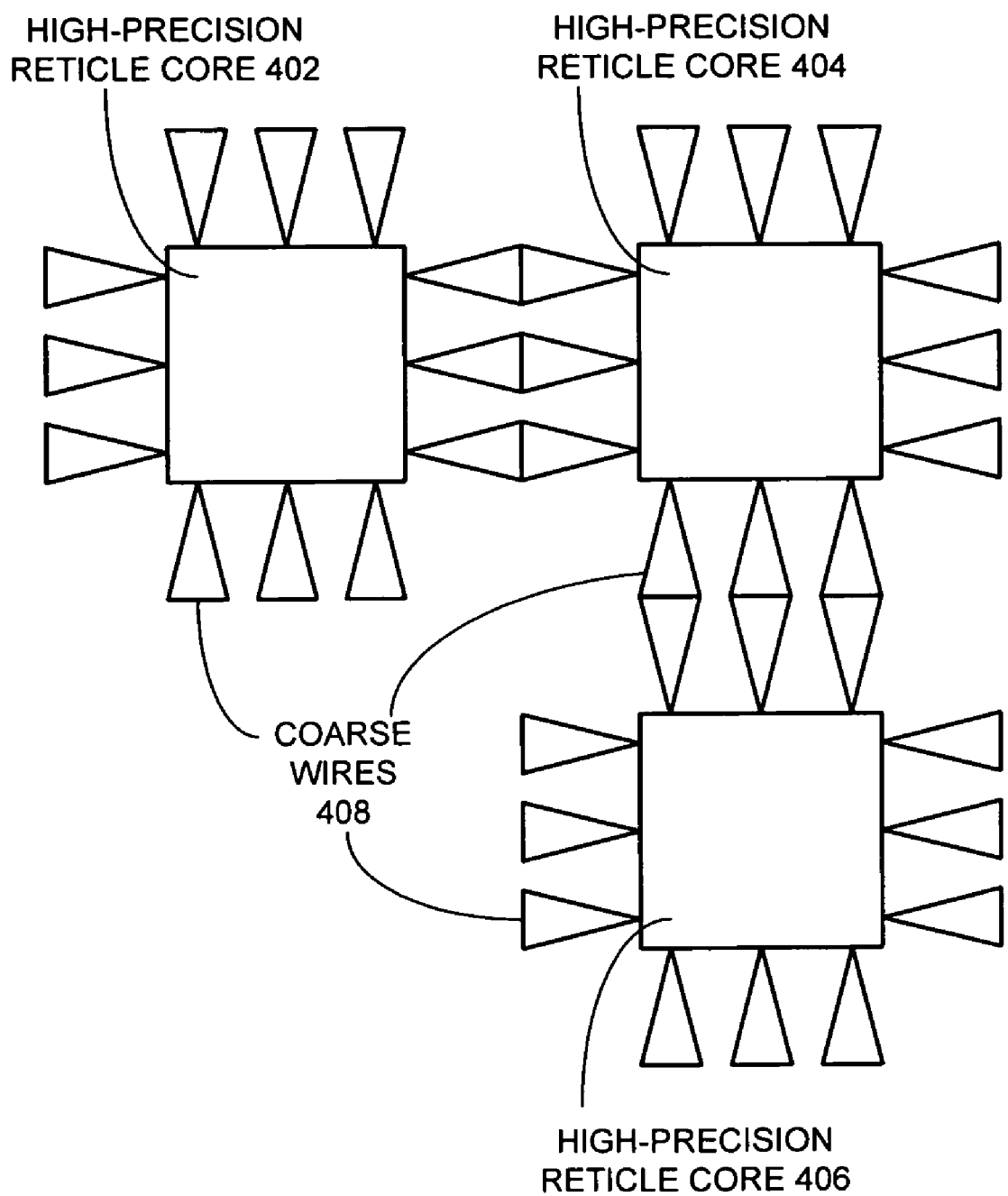
FIG. 4 illustrates multiple high-precision reticles connected by low-precision coarse wires in accordance with an embodiment of the present invention.

In one embodiment of the present invention, extremely large chips are fabricated by constructing multiple large reticles and imaging them across a wafer or segment of a wafer. These reticles have a dense and focused core, and they have coarse wires at their periphery. By stepping and repeating these reticles such that their coarse wires overlap and intersect, a Wafer-Scale Integration chip can be constructed without having to use separate masks for the cores and for the wires between the cores. For example, FIG. 4 illustrates high-precision reticle cores 402, 404, and 406 connected by low-precision coarse wires 408 in accordance with an embodiment of the present invention.

Figure 5:
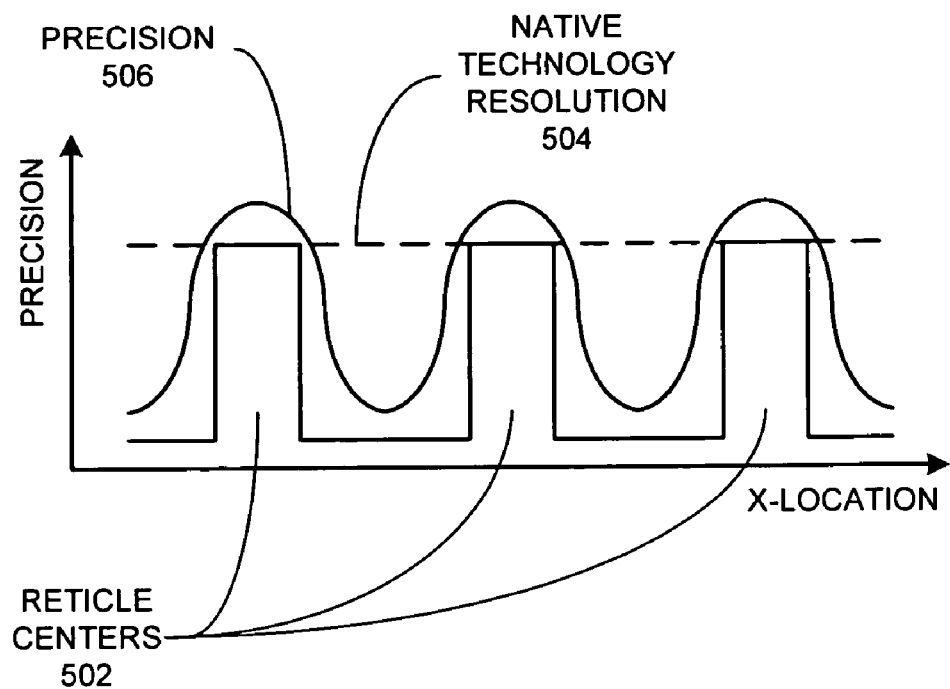
FIG. 5 presents a graph illustrating the periodic characteristic of the precision of features across a wafer in accordance with an embodiment of the present invention.

FIG. 5 presents a graph illustrating the periodic characteristic of the precision of features across a wafer in accordance with an embodiment of the present invention. The precision is plotted against the x-location on the wafer. Each imaged reticle has its center-of-focus at reticle centers 502. Native technology resolution 504 is the resolution available for the lithographic system using a given wavelength of light. Precision 506 illustrates the periodic characteristic of the precision for different locations on the wafer. Thus, the precision used by the system periodically increases at reticle centers 502 and periodically decreases between reticles.

The differences between high-precision and low-precision regions do not need to be binary as shown in FIG. 5. Because the focus at the very center of an imaged reticle is the sharpest, and it optically "diffuses" when moving radially from the center, a series of components with feature sizes increasing from the finest-possible resolution at the center of the reticle can be fabricated.

Figure 6:
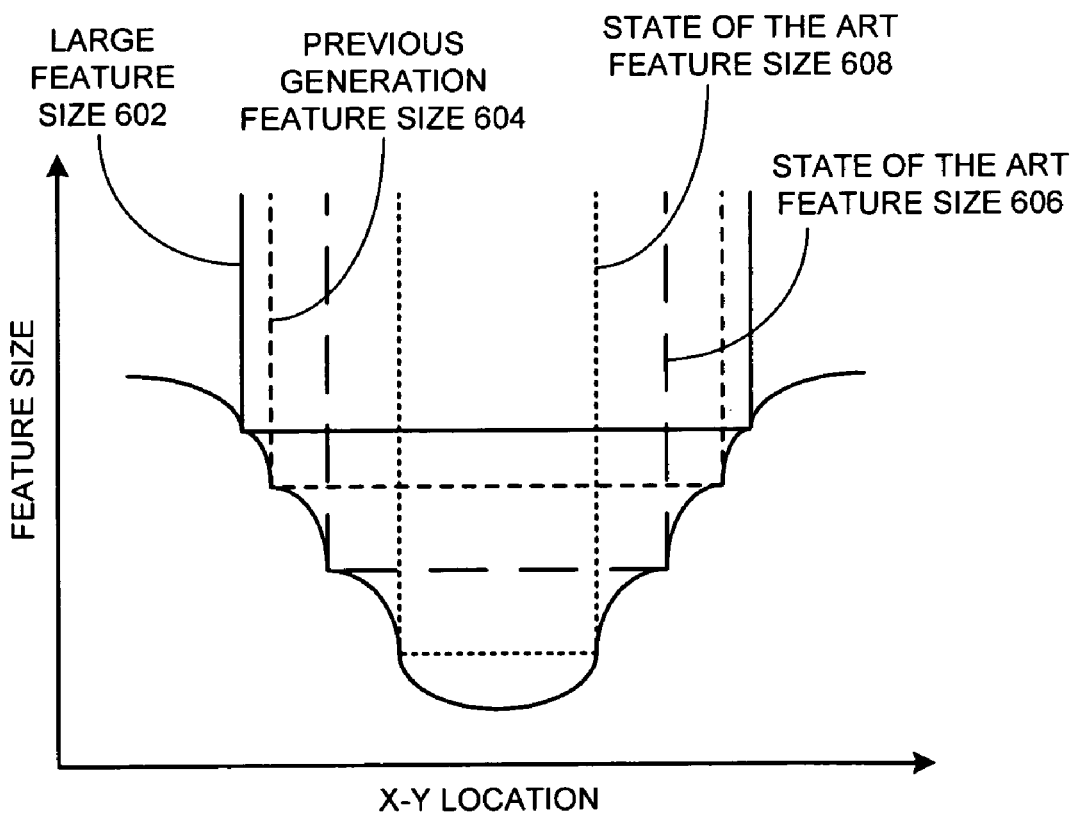
FIG. 6 illustrates multiple levels of precision on a reticle in accordance with an embodiment of the present invention.

FIG. 6 illustrates multiple levels of precision on a reticle in accordance with an embodiment of the present invention. The feature size is plotted against the x-y location on the wafer. It illustrates large feature size 602, previous generation feature size 604, and state of the art feature sizes 606 and 608.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for fabricating a semiconductor chip, comprising:

receiving a reticle which includes a pre-determined high-resolution region and a pre-determined region outside of the high-resolution region, wherein the high-resolution region provides sharp optical focus for a given wavelength of light used by a lithography system, and wherein the region outside of the high-resolution region provides a lower resolution of optical focus, and wherein the region outside of the high-resolution region surrounds a periphery of the high-resolution region;

placing patterns for components which require fine line-widths within the high-resolution region of the reticle;

placing patterns for components which do not require fine line-widths within the region outside of the high-resolution region of the reticle, thereby utilizing the region outside of the high-resolution region of the reticle instead of avoiding the region outside of the high-resolution region of the reticle;

wherein the coarseness for components placed within the region outside of the high-resolution region of the reticle is increased to compensate for the loss of optical focus outside of the high-resolution region.

2. The method of claim 1, wherein placing the patterns for components which require fine line-widths involves placing patterns for dense, finely-patterned memory structures within the high-resolution region of the reticle.

3. The method of claim 1, wherein placing the patterns for components which do not require fine line-widths involves placing patterns for coarse wires and coarse transistors outside of the high-resolution region of the reticle.

4. The method of claim 1, wherein placing the patterns for components which do not require fine line-widths involves placing patterns for capacitively, inductively, or optically coupled terminals outside of the high-resolution region of the reticle.

5. The method of claim 1, wherein the coarseness of patterns placed outside of the high-resolution region of the reticle increases by gradual changes in the minimum dimensions of transistors and wires as the patterns are placed further from the high-resolution region of the reticle.

6. The method of claim 1, wherein the coarseness of patterns placed outside of the high-resolution region of the reticle increases by large focus-steps at the boundary between the high-resolution region of the reticle and the region outside of the high-resolution region of the reticle.

7. The method of claim 1, further comprising:

creating multiple large reticles, which have a dense core within a high-resolution region, and which have coarse wires outside of the high-resolution region; and imaging the large reticles across a wafer by stepping the reticles so that the coarse wires overlap and intersect, thereby obviating the need to use separate lithographic masks for the dense cores and for the coarse wires between the dense cores to create a wafer-scale integration chip.

* * * * *

UNITED STATES PATENT AND TRADEMARK OFFICE
CERTIFICATE OF CORRECTION

PATENT NO.        : 7,763,396 B2                                        Page 1 of 1
APPLICATION NO.   : 11/355757
DATED             : July 27, 2010
INVENTOR(S)       : David C. Douglas et al.

It is certified that error appears in the above-identified patent and that said Letters Patent is hereby corrected as shown below:

In the Specification (at column 1, lines 6-8) please insert the wording --The United States Government has a paid-up license in this invention and the right in limited circumstances to require the patent owner to license others on reasonable terms as provided for by the terms of Agreement No. NBCH3039002 awarded by the Defense Advanced Research Projects Administration--.

Signed and Sealed this
Thirtieth Day of December, 2014

Michelle K. Lee
*Deputy Director of the United States Patent and Trademark Office*